(12) United States Patent
Lim et al.

(10) Patent No.: US 8,643,461 B2
(45) Date of Patent: Feb. 4, 2014

(54) INTEGRATED TRANSFORMER

(75) Inventors: Chee Chong Lim, Singapore (SG); Johnny Kok Wai Chew, Singapore (SG); Suh Fei Lim, Singapore (SG); Wei Gao, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 78 days.

(21) Appl. No.: 13/095,932

(22) Filed: Apr. 28, 2011

(65) Prior Publication Data

US 2012/0274434 A1 Nov. 1, 2012

(51) Int. Cl.
*H01F 5/00* (2006.01)
(52) U.S. Cl.
USPC .......................................................... 336/200
(58) Field of Classification Search
USPC ............. 336/65, 200, 232, 206–208; 257/531
See application file for complete search history.

(56) References Cited

U.S. PATENT DOCUMENTS

| | | | |
|---|---|---|---|
| 4,816,784 A | 3/1989 | Rabjohn | |
| 6,577,219 B2 | 6/2003 | Visser | |
| 6,635,949 B2 * | 10/2003 | Lowther et al. | 257/531 |
| 6,794,977 B2 * | 9/2004 | Christensen | 336/200 |
| 6,867,677 B2 * | 3/2005 | Nielson | 336/200 |
| 6,927,664 B2 * | 8/2005 | Nakatani et al. | 336/200 |
| 7,039,381 B2 | 5/2006 | Yang et al. | |
| 7,164,339 B2 * | 1/2007 | Huang | 336/200 |
| 7,372,352 B2 | 5/2008 | Lee et al. | |
| 7,456,721 B2 * | 11/2008 | Chiu | 336/200 |
| 2003/0085788 A1 | 5/2003 | Yue | |
| 2004/0017278 A1 | 1/2004 | Castaneda et al. | |
| 2004/0080392 A1 * | 4/2004 | Yu et al. | 336/200 |
| 2004/0108927 A1 | 6/2004 | Castaneda et al. | |
| 2006/0077028 A1 | 4/2006 | Huang | |
| 2008/0284552 A1 * | 11/2008 | Lim et al. | 336/200 |

FOREIGN PATENT DOCUMENTS

| | | |
|---|---|---|
| DE | 102005047055 | 4/2007 |
| DE | 10261385 | 5/2007 |
| DE | 102005050484 | 1/2010 |
| DE | 102006027586 | 11/2011 |

OTHER PUBLICATIONS

John R. Long, Monolithic Transformers for Silicon RF IC Design, IEEE Journal of Solid-State Circuits, vol. 35, No. 9, Sep. 2000, pp. 1368-1382.
Jianjun J. Zhou and David J. Allstot, Monolithic Transformers and Their Application in a Differential CMOS RF Low-Noise Amplifier, IEEE Journal of Solid-State Circuits, vol. 33, No. 12, Dec. 1998, pp. 2020-2027.
Sunderarajan S. Mohan, Patrick Yue, Maria Del Mar Hershenson, S. Simon Wong and Thomas H. Lee, Modeling and Characterization of On-Chip Transformers, presented at Electron Devices Meeting, 1998, IEDM'98 Technical Digest., International, 1998, pp. 531-534.
Ja-Yol Lee et al., A 1.8 GHz fully differential VCO using SiGe BiCMOS process technology, ICMMT 2002, pp. 58-61.

* cited by examiner

*Primary Examiner* — Tuyen Nguyen
(74) *Attorney, Agent, or Firm* — Horizon IP Pte. Ltd.

(57) ABSTRACT

A device having a substrate and a dielectric layer disposed over the substrate is disclosed. The device includes a transformer layout disposed in the dielectric layer. The transformer layout includes an integrated transformer having primary and secondary coil elements. The first and second coil elements are configured to result in noise-self cancellation effect.

20 Claims, 13 Drawing Sheets

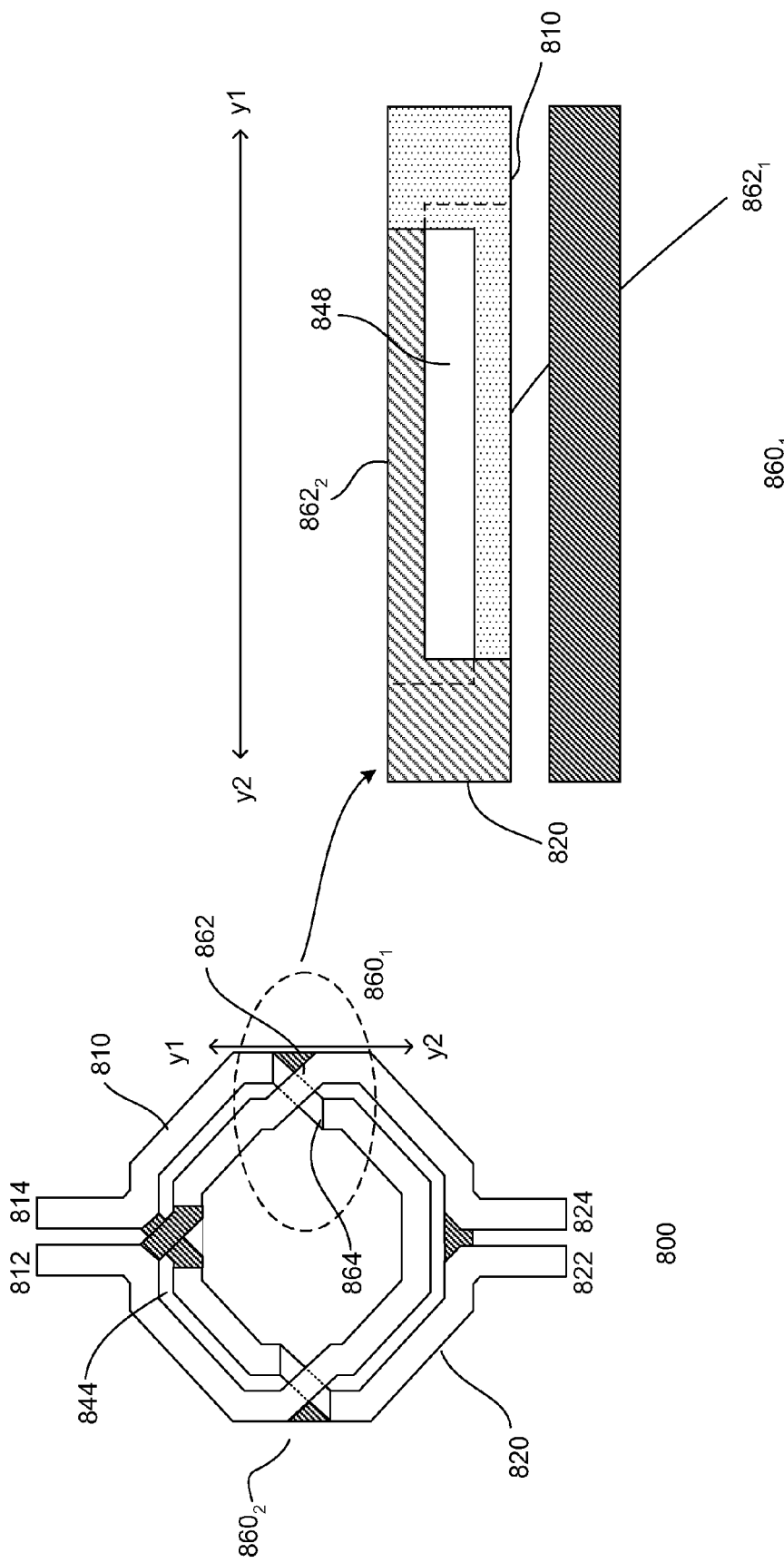

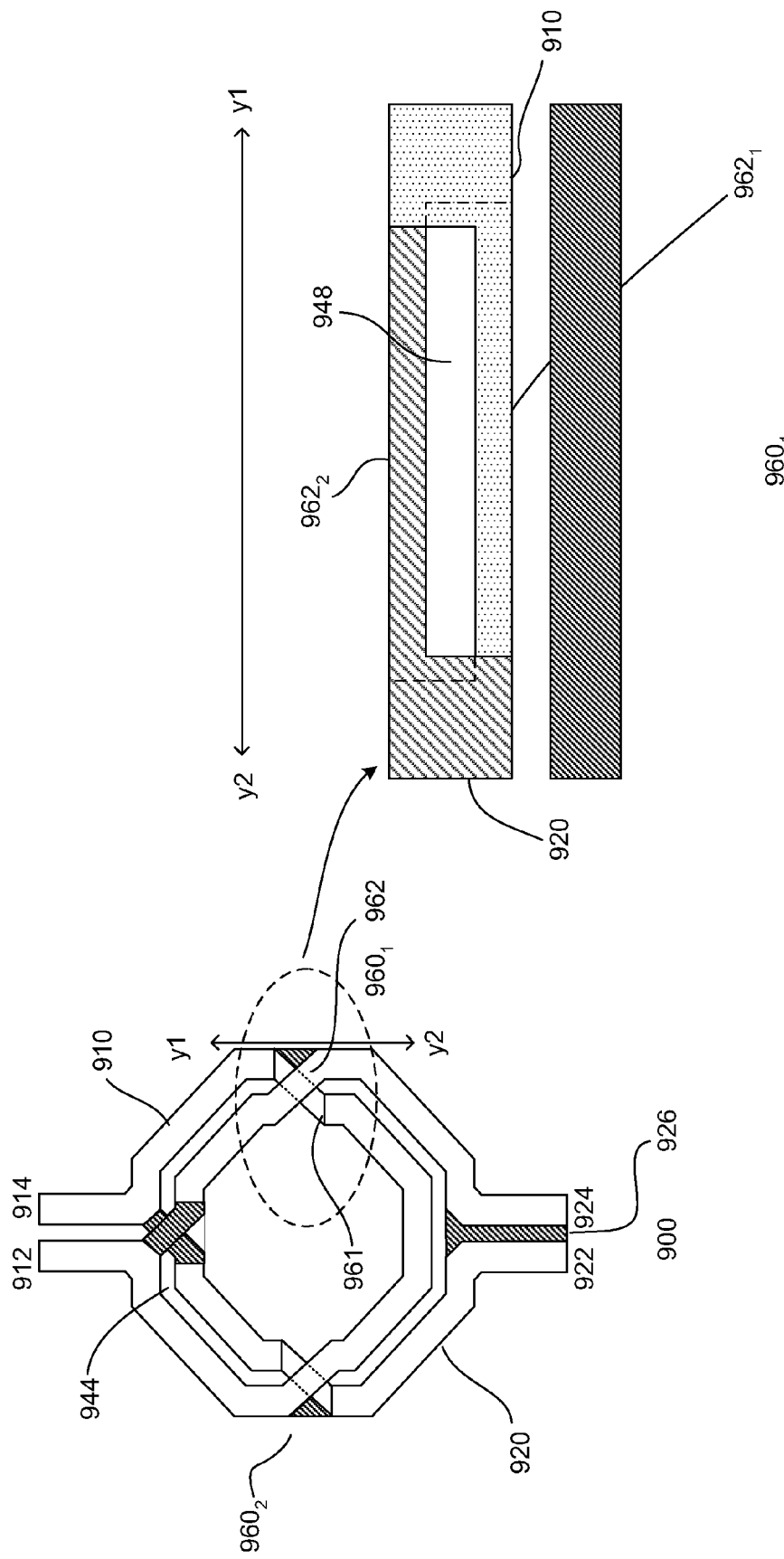

INTEGRATED TRANSFORMER

BACKGROUND

Monolithic transformers are used in on-chip radio frequency (RF) integrated circuits (ICs) to perform a range of functions including impedance matching, signal coupling and phase splitting. Monolithic transformers provide a number of advantages for the circuit designer over conventional transformers including lower power consumption and higher packaging density. Monolithic transformers enable power amplifiers to be fabricated by standard CMOS processes.

However, there are issues with transformers. For example, they might have low self-resonant frequencies, high mismatch between the coils and trade-offs between performance and silicon area consumption.

Therefore, challenges for exploring more efficient transformers exist.

SUMMARY OF THE INVENTION

A transformer is disclosed. In one embodiment, the transformer includes a transformer layout having an integrated transformer. The integrated transformer includes primary and secondary coil elements. The first and second coil elements are configured to result in noise-self cancellation effect.

In one embodiment, a device is disclosed. The device includes a substrate and a dielectric layer disposed over the substrate. The device further includes a transformer layout disposed in the dielectric layer. The transformer layout includes an integrated transformer having primary and secondary coil elements. The first and second coil elements are configured to result in noise-self cancellation effect.

In yet another embodiment, a method of forming a device is presented. The method includes providing a substrate and forming a dielectric layer over the substrate. The method further includes forming a transformer layout in the dielectric layer. The transformer layout includes an integrated transformer having primary and secondary coil elements. The first and second coil elements are configured to result in noise-self cancellation effect.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 8a shows a plan view of an embodiment of an integrated transformer;
FIG. 8b shows a magnified view of a cross-over location along axis y1-y2;
FIG. 9a shows a plan view of an embodiment of an integrated transformer;
and
FIG. 9b shows a cross-over region.

DETAILED DESCRIPTION

Embodiments relate to transformers and methods of fabricating transformers. The transformers are integrated transformers which are formed on a substrate. For example, the transformers are monolithic transformers. The substrate may include other circuit components, such as complementary metal oxide (CMOS) components, along with the transformer, forming, for example, an integrated circuit. The IC may be any type of IC. The IC may be incorporated into, for example, consumer products.

Figure 1:
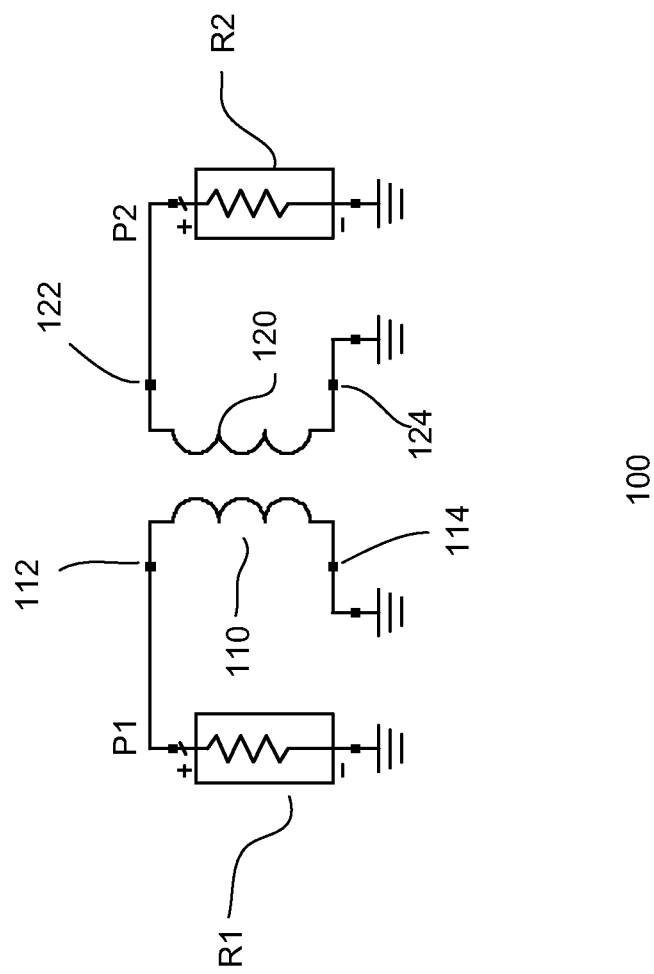
FIG. 1 shows an embodiment of a transformer.

FIG. 1 shows an embodiment of a transformer 100. The transformer includes first and second coils 110 and 120. The first coil, for example, serves as a primary coil and the second coil serves as a secondary coil. In other embodiments, the first coil may serve as the secondary coil while the second coil may serve as a primary coil. The first coil includes first and second terminals 112 and 114; the second coil includes first and second terminals 122 and 124. In one embodiment, the first terminal of the first coil serves as a first port P1 of the transformer and the first terminal of the second coil serves as a second port P2 of the transformer. The second terminals of the coils, for example, may be coupled to constant DC supply, such as ground. The ground may be a physical or a virtual ground.

As shown, resistors R1 and R2 are coupled to the first and second ports of the transformers. The resistors are provided to depict the presence of resistive components within the coils. For example, the resistors represent resistance due to the non-ideal metal traces of the coils which have a finite conductivity. The coil resistance, for example, may be about 50Ω. The actual coil resistance may depend on, for example, the material used or design parameters. Other factors may also affect the coil resistance.

The first coil comprises F number of turns and the second coil comprises S number of turns. The turn ratio of the first and second coils is defined as F:S. As shown, the first and second coils are symmetrical. For example, the first and second coils have about the same number of turns, producing a transformer with a turn ratio of about 1:1. In other embodiments, the transformer may have non-symmetrical coils. In a non-symmetrical transformer, F is not equal to S, resulting in a transformer having a turn ratio other than 1:1. For example, the transformer may have a turn ratio 1:n, such as 1:2 or 1:4. It is also understood that n needs not be a whole number. For example, the transformer may have a turn ratio where n is equal to 1.5 (turn ratio=1:1.5). Providing a transformer with other turn ratios may also be useful. The desired ratio may depend on, for example, design requirements. The desired turn ratio may also depend on the number of turns of wires in both the first and second coils which may also be related to the lengths of the wires used in both coils.

Figure 2A:
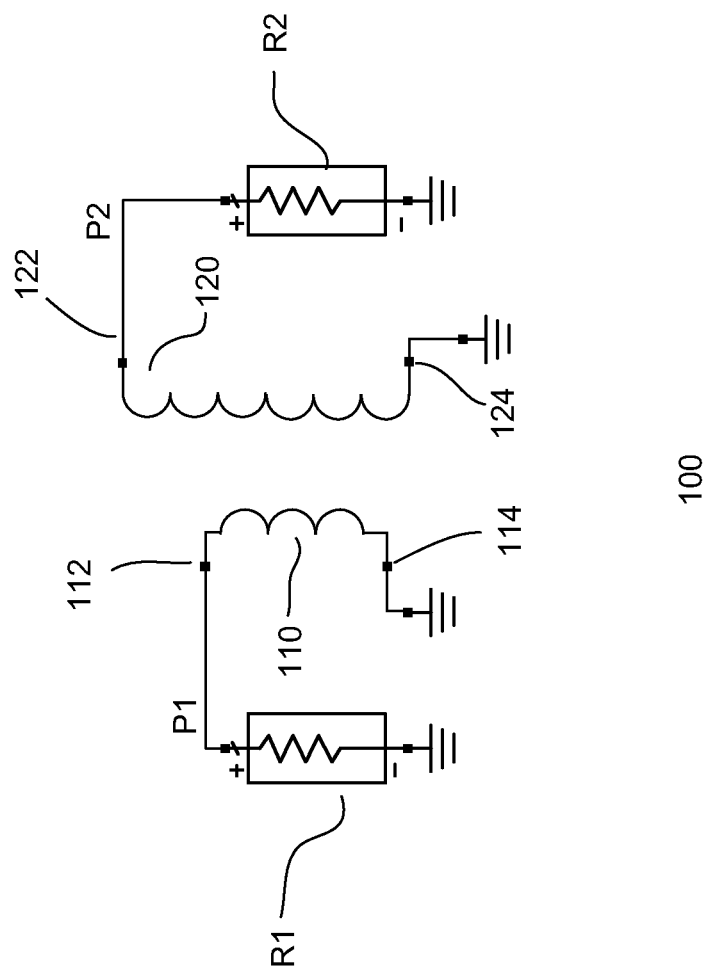
FIGS. 2a-b show alternative embodiments of transformers.
Figure 2B:
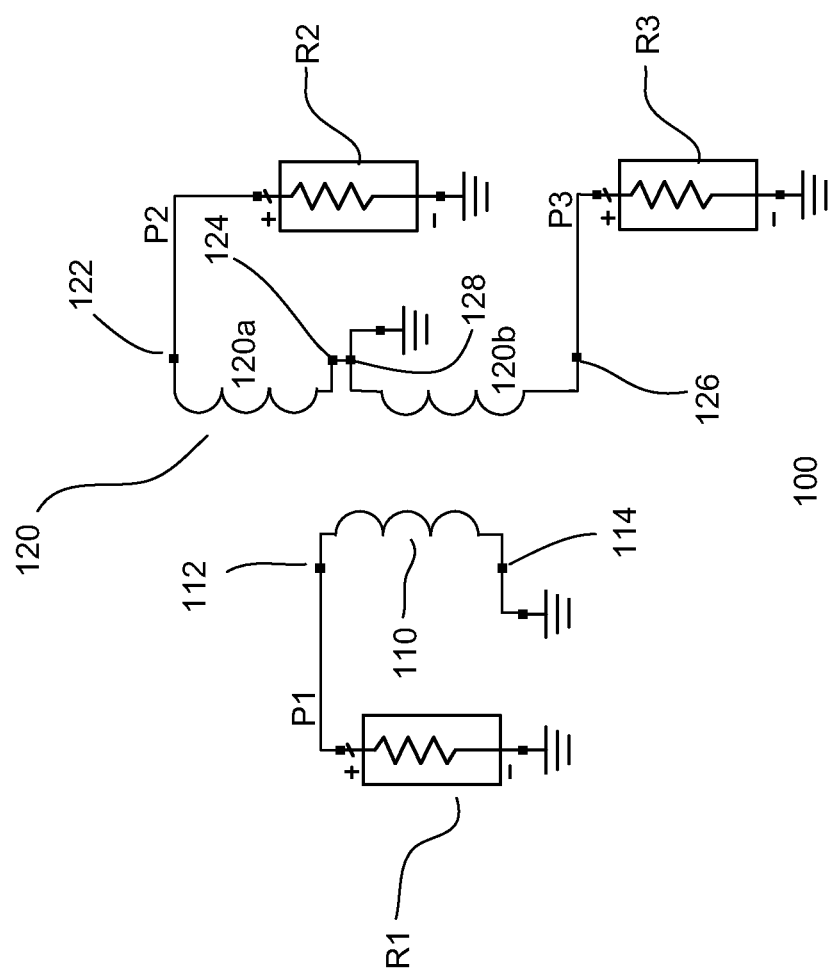

FIGS. 2a-b show alternative embodiments of transformers 100. The transformers are similar to the transformer described in FIG. 1. Referring to FIG. 2a, the transformer includes first and second coils 110 and 120. The first coil, for example, serves as a primary coil and the second coil serves as a secondary coil. The first coil includes first and second terminals 112 and 114. Similarly, the second coil includes first and second terminals 122 and 124. The first terminal of the first coil may serve as a first port P1 of the transformer and the first terminal of the second coil may serve as a second port P2 of the transformer. The second terminals of the coils, for example, may be coupled to a constant DC supply, such as ground. The ground may be a physical or virtual ground.

Resistors R1 and R2 are shown coupled to the first and second ports of the transformers. The resistors are provided to depict the presence of resistive components within the coils. The coil resistance, for example, may be about 50Ω. As illustrated, the second coil has about 2 times the number of turns than the first coil, forming a transformer with about a 1:2 turn ratio. Providing a transformer having other turn ratios may also be useful.

Referring to FIG. 2b, the transformer includes first and second coils 110 and 120. The first coil, for example, serves as a primary coil and the second coil serves as a secondary coil. The first coil includes first and second terminals 112 and 114. In one embodiment, the second coil includes first and second sub-coils 120a-b. The first sub-coil includes first and second terminals 122 and 124 and the second sub-coil includes first and second terminals 126 and 128. The first terminal of the first coil may serve as a first port P1 of the transformer and the first terminals of the first and second sub-coils of the second coil may serve as second and third ports P2 and P3 of the transformer. The second terminals of the coils, for example, may be coupled to a constant DC supply, such as ground. The ground may be a physical or virtual ground. In one embodiment, the second terminals of the first and second sub-coils or the second coil are commonly coupled. In one embodiment, the common terminal of the first and second sub-coils is coupled to a virtual ground. Other configurations of the second terminals of the coils may also be useful.

Resistors R1, R2 and R3 are shown coupled to the first, second and third ports of the transformers. The resistors are provided to depict the presence of resistive components within the coils. For example, the resistors represent resistance due to the non-ideal metal traces of the coils which have a finite conductivity. The coil resistance, for example, may be about 50Ω. The actual coil resistance may depend on, for example, the material used or design parameters. Other factors may also affect the coil resistance. As illustrated, the second coil has about 2 times the number of turns than the first coil, forming a transformer with about a 1:2 ratio. Providing a transformer having other turn ratios may also be useful.

The first and second coils are configured to result in noise self-cancellation effect. In one embodiment, the coils are intertwined to result in noise self-cancellation effect. Additionally, the physical length of the two coils can be precisely controlled. For example, in the case of a transformer with a 1:1 turn ratio, the lengths of the coils can be equalized. As for the case of a 1:n turn ratio, where n≠ 1, high turn ratio accuracy can be achieved by controlling the physical lengths of the coils. As such, the transformer has improved magnetic and electrical equalization, increasing power efficiency.

In one embodiment, the transformer may be configured as a balanced-unbalanced (balun) transformer. In a balun transformer, one of the coils serves as a balanced coil and the other serves as the unbalanced coil. For example, the port coupled to the balanced coil is a balanced port and the port coupled to the unbalanced coil is the unbalanced port of the transformer. The balanced coil, for example, is the coil having the virtual ground or a common terminal. The balun transformer may be configured in a circuit to perform balanced-to-unbalanced conversion (e.g., differential-to-single-ended conversion) or unbalanced-to-balanced conversion (e.g., single-ended-to-differential conversion). The various embodiments of balun transformers have improved performance over conventional balun transformers. For example, the transformers have improved amplitude and phase balance. The balun transformer can be implemented into a differential VCO. Other applications for the balun transformer may also be useful.

Figure 3:
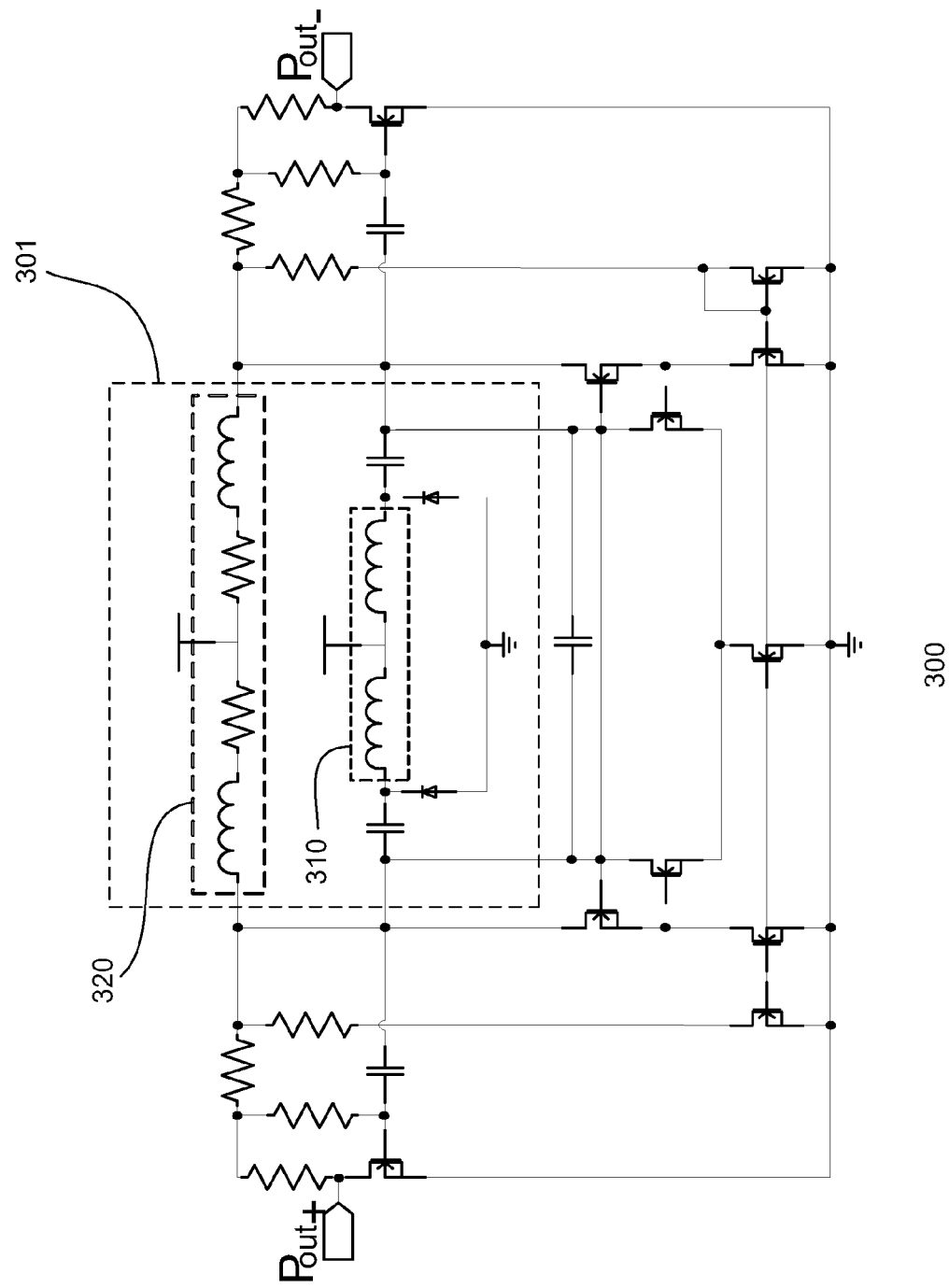
FIG. 3 shows an embodiment of a VCO circuit.

FIG. 3 shows an embodiment of a VCO circuit 300. As shown, the VCO circuit includes a transformer. The transformer, in one embodiment, comprises a balun transformer 301. The balun transformer, for example, may be one as described in the present specification. The balun transformer includes first and second coils 310 and 320. The balun transformer may be employed in other types of VCO circuits or other types of circuits.

Figure 4B:
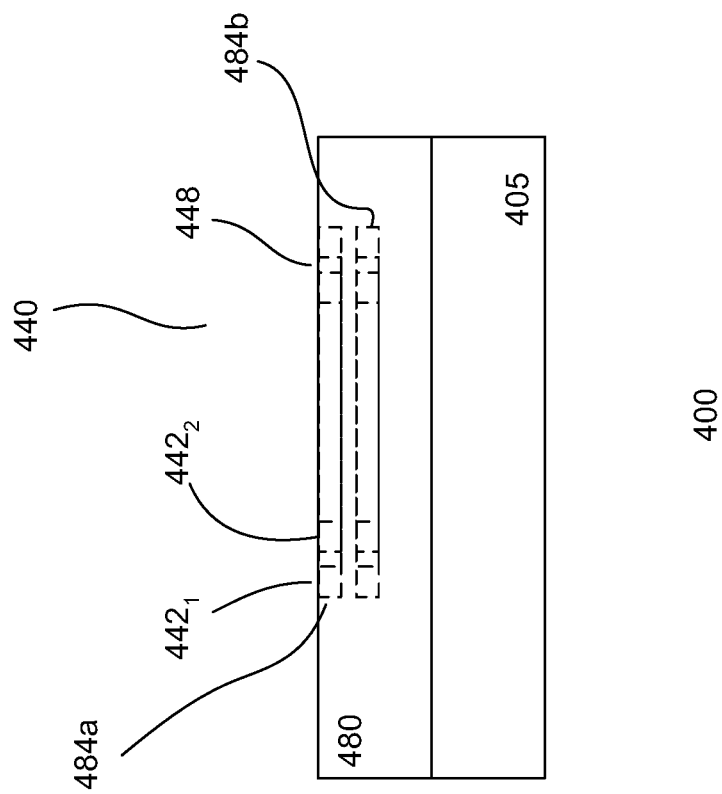
FIGS. 4a-b show plan and cross-sectional views of an embodiment of a device.
Figure 4A:
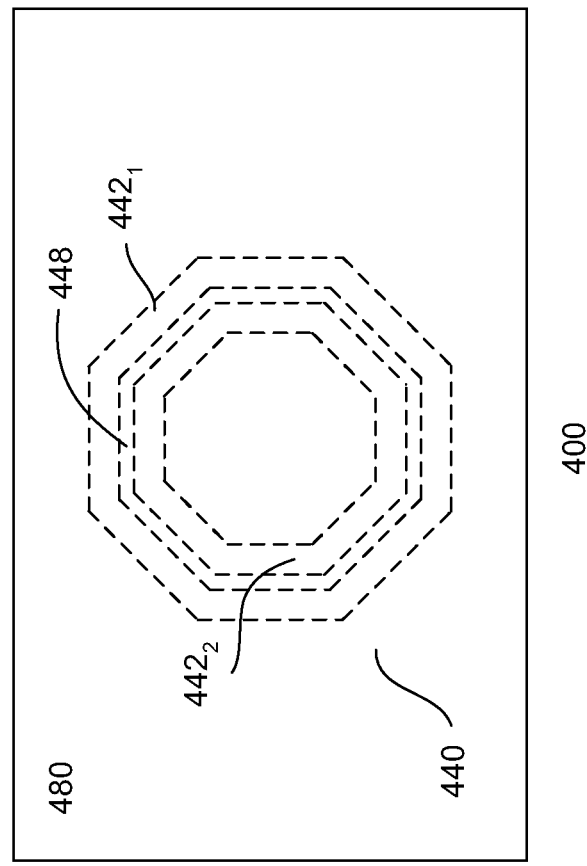

FIGS. 4a-b show plan and cross-sectional views of an embodiment of a device 400. A substrate 405 is provided on which the device is formed. The substrate, for example, comprises a silicon substrate. The substrate, for example, may be a p-type doped silicon substrate. Other types of doped or intrinsic substrates may also be useful. For example, germanium-based including silicon germanium, gallium arsenide, silicon-on-insulator (SOI), or sapphire substrates may be employed. The substrate can be prepared with circuit components (not shown). Circuit components can include, for example, transistors, capacitors and/or resistors. Other types of circuit components are also useful.

A dielectric layer 480 is prepared on the substrate over the circuit components. The dielectric layer, for example, may include a metal layer of a device, such as an IC. It is understood the dielectric layer may include a plurality of metal layers of the IC.

A transformer layout 440 is provided in the dielectric layer. In one embodiment, the transformer layout includes a primary or main level 484a. The primary layout level may be provided in any metal level $M_i$ of the device, where i=1 is the bottom level and i=T is the top level. In one embodiment, the layout may be provided in a top metal level of the IC (e.g., $M_T$). Providing the layout in other metal layers may also be useful. In one embodiment, the primary layout may encompass more than one metal layer. This may increase current flow due to larger cross-sectional areas of the coils. For example, the layout may encompass the top and penultimate metal levels ($M_T$ and $M_{T-1}$). Any other combinations of metal levels may also be useful for the transformer layout.

The layout comprises a plurality of virtual ring shaped placements. For example, the layout comprises x number of virtual concentric ring shaped placements $442_{1-x}$. In one embodiment, x is a whole number ≥2. Preferably, x is an even whole number ≥2. Providing x having other values may also be useful. The first (n=1) ring placement, for example, corresponds to the outermost ring placement and x (n=x) corresponds to the innermost ring placement. As shown, the layout includes two concentric ring placements $442_1$ and $442_2$. The ring placements are separated by a space 448.

The ring shaped placements correspond to locations of coil elements of the transformer. The number of ring shaped placements, for example, may depend on the number of turns for the first coil. In one embodiment, the number of ring shaped placements is equal to 2 times the number of turns for the first coil. For example, in the case of a transformer in which the first coil has one turn, the transformer comprises two ring shaped placements. In other examples, four ring placements are provided for a first coil having 2 turns.

The concentric ring placements, for example, comprise a polygonal shape. The polygon may include an even number of sides. In one embodiment, adjacent sides of the polygon form an angle greater than 90°. For example, the angle may be about 135°. Other angles greater than 90° may also be useful. Providing angles greater than 90° avoids design rule check violations. Angles which are 90° or less, for example, cause current crowding effect, which degrades device performance. In an embodiment as shown, the concentric ring placements comprise an octagonal shape. Providing a polygon with other number of sides, such as six, may also be useful. In yet other embodiments, the concentric ring placements may have other geometric shapes, including non-polygonal shapes.

Such a configuration of ring shaped placements can be employed for any 1:n ratio transformer, including one where n=1. For example, a 1:1 ratio transformer may be formed by providing 4 ring shaped placements. In the case where a transformer with 1:n ratio is desired in which n>1, additional ring shaped placements may be provided in other transformer layout levels for the secondary coil. For example, a secondary layout level 484b may be provided for the secondary coil. The secondary layout level may be provided in a metal level below the primary layout level. In some embodiments, for applications wherein the primary layout level does not occupy the top metal level, the secondary layout may be disposed above the primary layout level. In yet other embodiments, the secondary level may be disposed above and below the primary layout level. A secondary level may encompass more than one metal layer. This may increase current flow due to a larger cross-sectional area of the conductive line.

In one embodiment, the secondary layout facilitates stacking of the coils of the transformer. For example, the second coil has a portion which is on one or more different levels than the primary layout level. For example, the second coil has a portion on a different level than the first coil. In one embodiment, the secondary layout is disposed within the area of the primary layout. For applications having more than one secondary layout, they are disposed within the area of the primary layout. Such a configuration advantageously enables a 1:n transformer, wherein n>1 to have the same area as a 1:1 transformer.

Figure 5A:
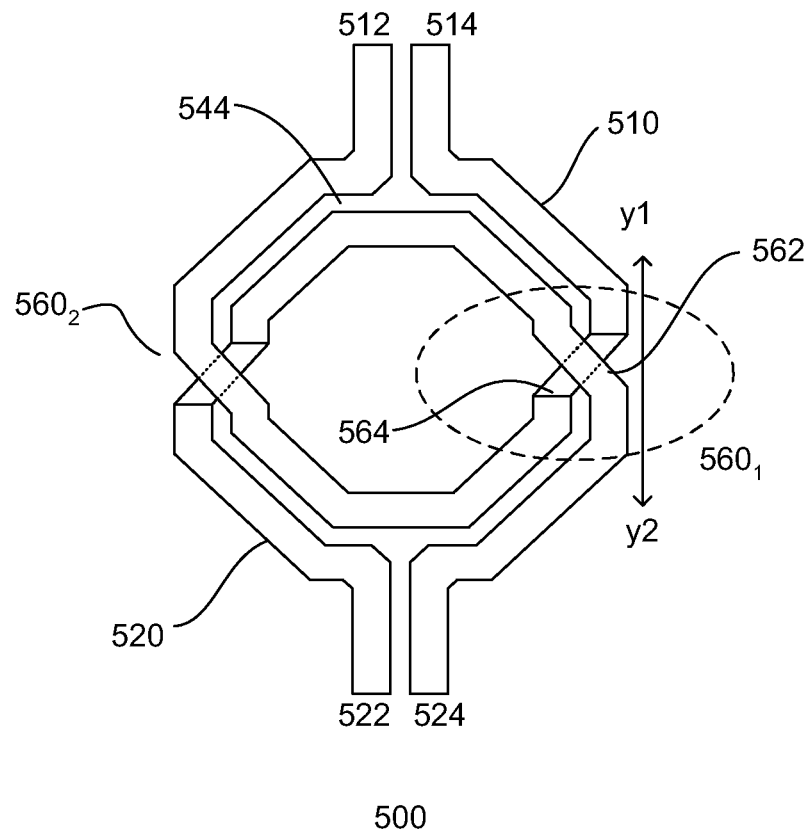
FIG. 5a shows a plan view of an embodiment of an integrated transformer.

FIG. 5a shows a plan view of an embodiment of an integrated transformer 500. The integrated transformer is formed in a transformer layout in a dielectric layer on a substrate. The transformer layer, for example, is similar to that shown in FIGS. 4a-b. In one embodiment, the transformer layout comprises hexagonal shaped concentric ring placements. As shown, the transformer layout includes first (outer) and second (inner) concentric ring layers. Providing other shaped or number of concentric ring placements is also useful.

The transformer comprises first and second coils 510 and 520. In one embodiment, the transformer comprises a 1:1 transformer. That is, the first and second coils have the same number of turns. Since the layout comprises two concentric ring placements, the transformer includes a first coil with one turn and a second coil with one turn. Providing a layout with other number of concentric placements may also be useful. For example, the layout may include four, six or eight concentric placements for a 1:1 transformer having either two, three or four turns for each of the first and second coils.

The first coil includes first and second terminals 512 and 514. The first and second transformer terminals are coupled to first and second ends of the first coil. The second coil includes third and fourth transformer terminals 522 and 524 coupled to first and second ends thereof. As shown, the terminals of the first coil and the second coil are located at different sides of the outermost concentric ring of the transformer layout. Preferably, the terminals of the first coil and the second coil are located on opposing sides of the outermost concentric ring of the transformer layout. Other configurations of terminals and transformer layout are also useful.

In one embodiment, portions of the first coil and second coil share a concentric ring placement. Preferably, first and second coils share equal or substantially equal portions of a concentric ring placement. For example, each concentric ring placement is occupied by about 50% of the first coil and 50% of the second coil.

Figure 5B:
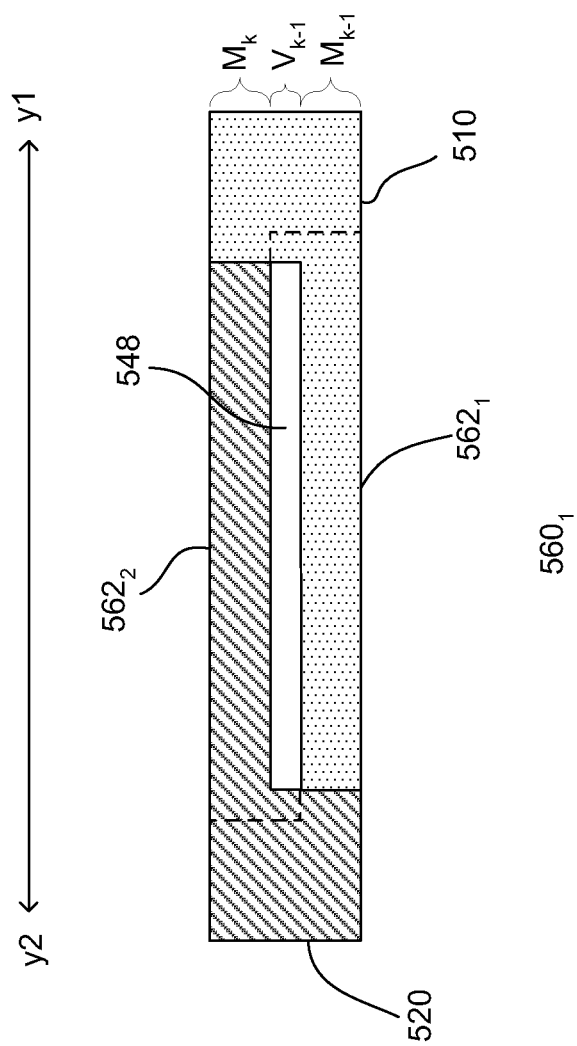
FIG. 5b shows a magnified view of a cross-over location along axis y1-y2.

In one embodiment, at least one cross-over location 560 is provided in the transformer. FIG. 5b shows a magnified view of the cross-over location $560_1$ along the axis y1-y2. The cross-over location comprises first and second cross connectors $562_1$ and $562_2$ to facilitate interleaving the coils of the transformer. In one embodiment, a cross connector changes a routing of a coil from one ring placement to an adjacent ring placement. For example, the cross connector transfers the routing of a coil from the $n^{th}$ ring placement to the n−1 or n+1 ring placement, where n=1 to x.

In one embodiment, the first and second coils comprise a thickness T at locations other than at the cross-over element. To route a coil from a concentric ring to an adjacent concentric ring, a cross connector 562 is provided. The cross connector, for example, is disposed in either the upper portion or lower portion of the coil having a thickness which is less than T. The upper and lower portions are separated by a middle portion 548.

The cross-over location $560_1$, as shown, comprises a first cross connector $562_1$. The first cross connector connects one portion of the first coil 510 in the outer ring placement (n=1) to another portion in the inner ring placement (n=2). In one embodiment, the first cross connector is provided at or connects the lower portions of the first coil. As such, the first cross connector changes the routing of the first coil from the outer ring placement to the inner ring placement. Similarly, a second cross connector $562_2$ connects one portion of the second coil 520 in the outer ring placement (n=1) to another portion in the inner ring placement (n=2). In one embodiment, the second cross connector is provided at or connects the upper portions of the second coil. By providing the second cross connector, the routing of the second coil changes from the inner ring placement to the outer ring placement.

A second cross-over region $560_2$ may be provided for the transformer. The second cross-over region may be similar to the first cross-over region. In one embodiment, the layout includes $2^x$ cross-over regions for a ring placement, where x is an integer. Providing other configuration of cross-over regions may also be useful. The second cross-over region includes first and second cross connectors to change the routing of the first coil from one concentric ring placement to an adjacent concentric ring placement. For example, the first connector changes the first coil routing from the inner ring placement to the outer ring placement; the second connector changes the second coil routing from the inner ring placement to the outer ring placement. As shown, the first connector connects lower portions of the first coil while the second connector connects upper portions of the second coil. Other configurations of cross connectors may also be useful.

The dielectric layer on which the transformer is formed may be, for example, an intermetal dielectric (IMD) layer. Interconnects of the device are formed in the IMD layer. A device may comprise numerous interconnect levels to interconnect the various circuit components to achieve the desired functions. For example, a device may include I number of interconnect levels, where 1 is the lowest level and I is the highest level.

An IMD layer includes a trench level in an upper portion which corresponds to the metal level ($M_k$). For example, interconnects or metal lines are disposed in the trench level of the IMD layer. A lower portion of the IMD layer includes a via level having contacts. Separating IMD layers may be an etch stop layer (not shown).

In one embodiment, the transformer is formed in two adjacent metal level $M_k$ and $M_{k-1}$ and a via level $V_{k-1}$ therebetween. For example, the dielectric layer in which the transformer is formed includes an IMD layer and the trench level of the next lower IMD layer. In one embodiment, the upper and lower metal levels correspond to the upper and lower portions of the transformer coil element while the via level therebetween corresponds to the middle portion. In one embodiment, the coil elements except for the cross-over portions have upper and lower portions interconnected by the via level. For example, the upper and lower portions are coupled by bar vias. Bar vias, for example, are similar to conductive lines formed in the trenches in the via level.

Figure 6B:
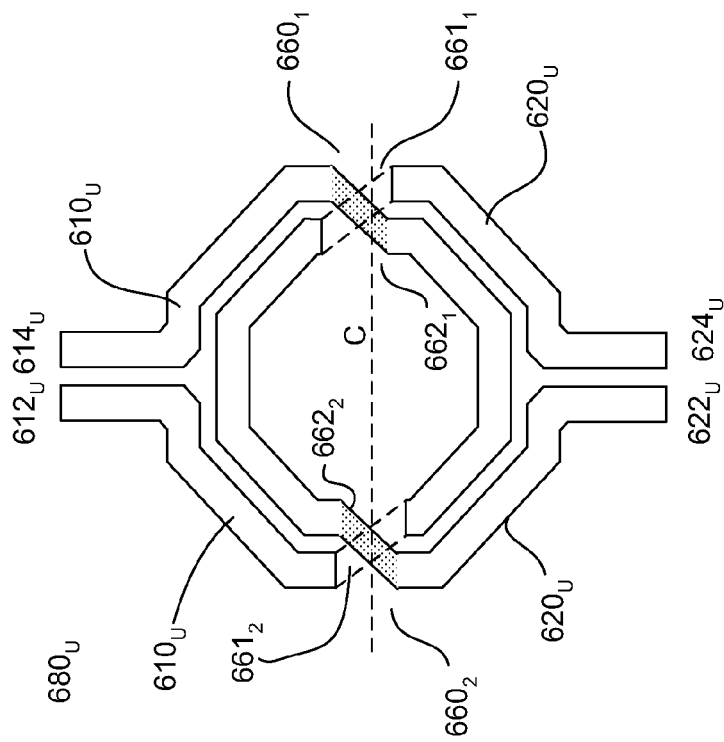
FIGS. 6a-b show an embodiment of a process for forming a transformer.
Figure 6A:
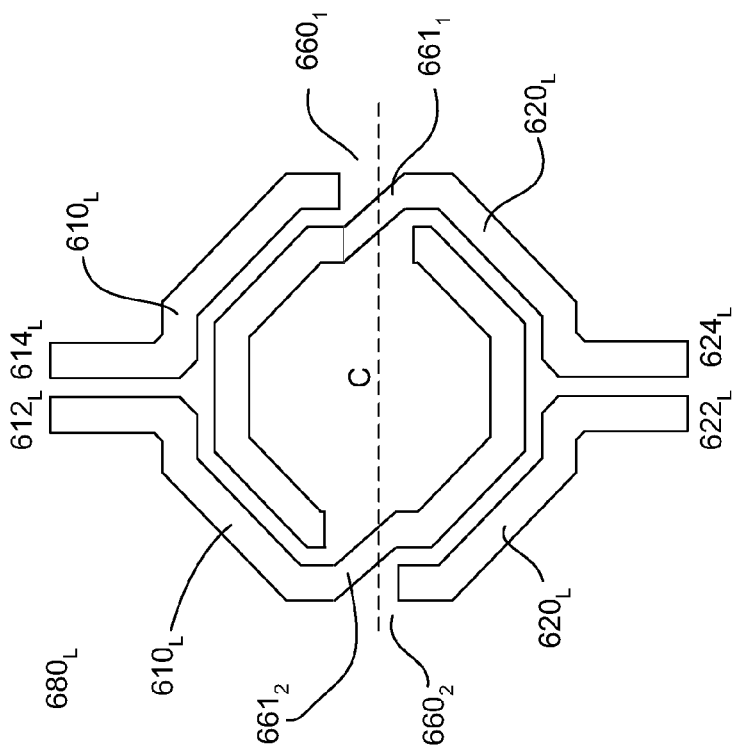

FIG. 6a-b show an embodiment of a process for forming a transformer 600. In one embodiment, the process forms a 1:1 transformer in a device, such as an IC. Other types of devices may also be useful. In FIG. 6a, a lower level of the transformer coils are formed in a lower dielectric layer $680_L$. The lower dielectric layer, for example, is an IMD layer of the device. In one embodiment, the lower dielectric layer corresponds to an IMD layer of the penultimate interconnect level. In other embodiments, the lower dielectric layer may correspond to an interconnect level other than the penultimate interconnect level.

Various types of dielectric material may be used for the dielectric layer. Preferably, the dielectric material comprises a dielectric material used for IMD of the device. For example, the dielectric layer may comprise ultra-low k (ULK) dielectric material. Other types of dielectric materials, including low k (LK), may also be employed.

In one embodiment, a transformer layer is provided in a transformer region of the lower dielectric layer. Trenches are formed in the lower dielectric layer which corresponds to the transformer layout. In one embodiment, trenches are formed in the trench level of the lower dielectric layer. The trenches may be formed in the same process used to form interconnects and contacts regions other than the transformer region of the lower dielectric layer. Interconnects and contacts may be formed by, for example, dual damascene techniques. Via first or trench first dual damascene techniques may be employed. Other dual damascene techniques may also be useful.

In a via first dual damascene technique, a mask is provided on the surface of the dielectric layer and patterned to form openings corresponding to locations of the vias. The mask may be a soft mask, such as a photoresist mask or a combination of a soft mask with a hard mask, such as TEOS or silicon nitride below. Other mask configurations or materials are also useful.

The dielectric layer is patterned to remove portions exposed by the mask to form vias. Patterning of the dielectric layer, for example, comprises an anisotropic etch, such as reactive ion etching (RIE). Other techniques for patterning the dielectric layer are also useful. The vias expose a contact region below. After forming the vias, the soft mask is removed. The soft mask is removed by, for example, ashing. Other techniques for removing the soft mask are also useful.

A trench soft mask is formed over the dielectric layer with openings corresponding to trenches. The dielectric layer is patterned to remove portions exposed by the mask to form trenches in an upper portion or trench level. The trench mask may be removed after forming the dual damascene openings with trenches in the trench level and vias in the via level. The trench and vias may also be formed by, for example, trench first dual damascene techniques.

In one embodiment, the transformer layout includes first and second concentric ring placements, similar to that described in FIGS. 4a-b. In one embodiment, the trench level of the lower dielectric layer is patterned to form trenches in the concentric ring placements. The trenches correspond to locations where lower portions of the first and second coils $610_L$ and $620_L$ are formed.

The lower portions of the coils or coil elements may be formed in a similar manner as forming interconnects. For example, a conductive material is deposited or formed on the substrate, filling the trenches of the lower dielectric layer. The conductive material, for example, comprises copper, aluminum, tungsten, alloys such as Al doped Cu, Mn doped Cu, or a combination thereof. Other types of conductive materials, including metals and alloys, are also useful. Preferably, the conductive material comprises a conductive material used to form interconnects of the device.

In one embodiment, the conductive material comprises copper. A copper seed layer (not shown) may be first formed to line the trenches. The seed layer may be formed by, for example, PVD. Other techniques for forming the seed layer may also be useful. The conductive material can be deposited by electro-plating. Other techniques, such as electro-less plating, CVD, PVD or sputtering, are also useful. The technique employed may depend on the material used.

The trenches may be lined with a barrier layer prior to forming the seed layer or depositing the conductive material. The barrier layer may line the surface of the dielectric layer and the trench openings. For applications with a hard mask, the barrier layer may line the surface of the hard mask and the trench openings. The barrier layer, for example, can comprise TaN, Ta, TiN or a combination thereof. Other type of barrier material, such as ruthenium, is also useful. Providing a barrier layer having multiple layers is also useful. The barrier can be formed by, for example, physical vapor deposition (PVD), chemical vapor deposition (CVD) or atomic layer deposition (ALD). Other techniques for forming the barrier are also useful.

Excess conductive material is removed to form the lower portions of the coils. In one embodiment, the excess material is removed by a planarizing process. The planarizing process removes excess conductive material and the liner layer on the surface of the second dielectric material layer. This results in the top surface of the conductive material being planar with the top surface of the second dielectric material. The planarizing process comprises, for example, a polishing process, such as chemical mechanical polishing (CMP), electro-CMP (eCMP) or a combination thereof. Other types of planarizing or polishing processes are also useful. The polishing process may include multiple polishing steps to remove the different materials, such as the conductive and barrier materials.

In applications which employ a hard mask, the planarizing process may also remove the hard mask from the surface of the dielectric layer, leaving interconnects having a planar surface. In alternative embodiments, where a dielectric hard mask is employed, it may remain after the planarizing process.

As shown, the lower first coil includes first lower and second lower coil terminals $612_L$ and $614_L$ and the lower second coil includes third and fourth lower coil terminals $622_L$ and $624_L$. As shown, first and second cross-over locations $660_{1-2}$ are provided to change position of the coils from one ring placement to another ring placement. The lower first coil occupies about ½ of the first or outer ring placement and about ½ of the inner ring placement. Likewise, the lower second coil occupies about ½ of the first or outer ring placement and about ½ of the inner ring placement. In one embodiment, the lower first and second coils occupy opposing halves of the inner and outer coil ring placements. Other coil arrangements may also be useful. The first and second coils are configured to have lateral magnetic coupling.

In one embodiment, a first portion of the lower first coil is coupled to the first lower coil terminal and is disposed in the first or outer ring placement along a first direction (e.g., counter clockwise) and crosses over to the second or inner ring placement at the second cross-over location $660_2$. The first portion of the lower first coil continues in the inner ring placement to the first cross-over location. The portion of the lower first coil from the lower first terminal to the second cross-over location occupies about ¼ of the outer ring placement and about ½ the inner ring placement from the second cross-over location to the first cross-over position. The lower second cross connector $661_2$ at the second cross-over location forms a continuous first portion of the lower coil from the lower first coil terminal to the first cross-over location. The lower second cross connector provides a diagonal cross-over from the outer to the inner ring placements.

In one embodiment, a cross-connector forms an angle which is greater than 90° with respect to the coil segments it is coupling. For example, the angle may be about 135°. Other angles greater than 90° may also be useful. Providing angles greater than 90° avoids design rule check violations. Angles which are 90° or less, for example, cause current crowding effect, which degrades device performance.

A second lower coil terminal is disposed adjacent to the first lower coil terminal. The second lower coil terminal is coupled to a second portion of the first lower coil which is disposed in the outer ring placement along a second direction (e.g., clockwise) to the first cross-over location. The second portion of the first lower coil occupies about a ¼ of the outer ring placement.

As shown, the lower first coil occupies about ½ of the outer ring placement and ½ of the inner ring placement. In one embodiment, inner and outer halves of ring placements occupied by the lower first coil are at opposing halves of the layout. For example, the first coil terminals and the first coil occupy a first half (e.g., top) of the outer ring placement while the first coil occupies an inner ring placement in an opposing half (e.g., bottom) of the transformer layout.

The lower second coil is arranged in the transformer layer similarly as the lower first coil, except that it is rotated 180° with respect to the lower first coil. For example, the fourth lower transformer terminal $624_L$ disposed in the opposing half of the transformer layout as the first and second lower transformer terminals is coupled to a first portion of the second lower coil and is disposed in the outer ring placement along a first direction (e.g., counter clockwise). The first portion of the second lower coil continues in the inner ring placement via a diagonal lower first cross connector $661_1$ at the first cross-over location until the second cross-over location. A second portion is coupled to a third lower transformer terminal adjacent to the fourth lower transformer terminal and is disposed in the outer ring placement along a second direction (e.g., clockwise).

In FIG. 6b, an upper dielectric layer $680_U$ is formed over the lower coil elements. The upper dielectric layer, for example, comprises an IMD layer disposed above the lower dielectric layer. The upper dielectric layer, for example, comprises the IMD layer of the top interconnect level of the device. The upper dielectric layer comprising other interconnect levels may also be useful.

The upper dielectric layer includes a transformer layout aligned with that of the lower dielectric layer. In one embodiment, the trench level of the upper dielectric layer is patterned to form upper coil elements of the transformer. In one embodiment, the pattern of the upper coil elements is the same as or similar to the lower coil elements except that it is flipped along a center axis C (dotted line) of the transformer layout.

As for the via level separating the upper and lower trench or interconnect levels, it is patterned similarly to the trench level to form a bar or trench via except in the cross-over locations. In the cross-over locations, the via level remains unpatterned (shaded portions). The patterning of the trench and via levels forms dual damascene structures.

The dual damascene structures are formed, for example, similar to that for forming interconnects in the upper dielectric layer. The dual damascene structures, for example, are filled with a conductive material and planarized to form upper coil elements in the transformer region and interconnects and contacts in other regions, as previously described.

In the cross-over locations, the dielectric material of the via level remains to separate the upper and lower coil elements. In other portions of the transformer layer, the first upper coil elements are coupled to the first lower coil elements, the second upper coil elements are coupled to the second lower coil elements and the upper transformer terminals are coupled to respective lower transformer terminals.

Figure 6C:
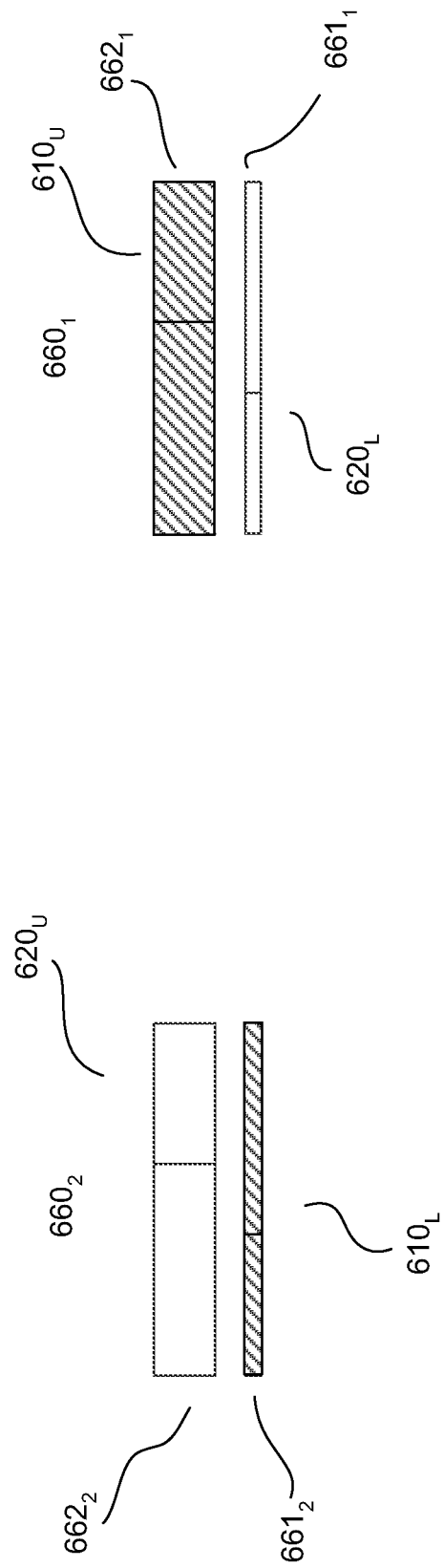
FIG. 6c shows a cross-sectional view of a transformer along a first and second cross-over locations.

FIG. 6c shows a cross-sectional view of the transformer 600 along the first and second cross-over locations $660_1$ and $660_2$. At the first cross-over location, the upper cross connector $662_1$ couples upper first coil elements in the inner and outer ring placements and lower cross connector $661_1$ couples lower second coil elements in the inner and outer ring placements. At the second cross-over location, the upper cross connector $662_2$ couples upper second coil elements in the inner and outer ring placements and lower cross connector $661_2$ couples lower first coil elements in the inner and outer ring placements. Dielectric material of the via level separates the upper and lower cross connectors in the cross-over locations.

As shown, the transformer has improved matching of coil lengths. This results in higher power efficiency. Furthermore, increased current flow can be achieved by forming a coil element in multiple metal levels to increase the cross-sectional area of a coil element.

Figure 7A:
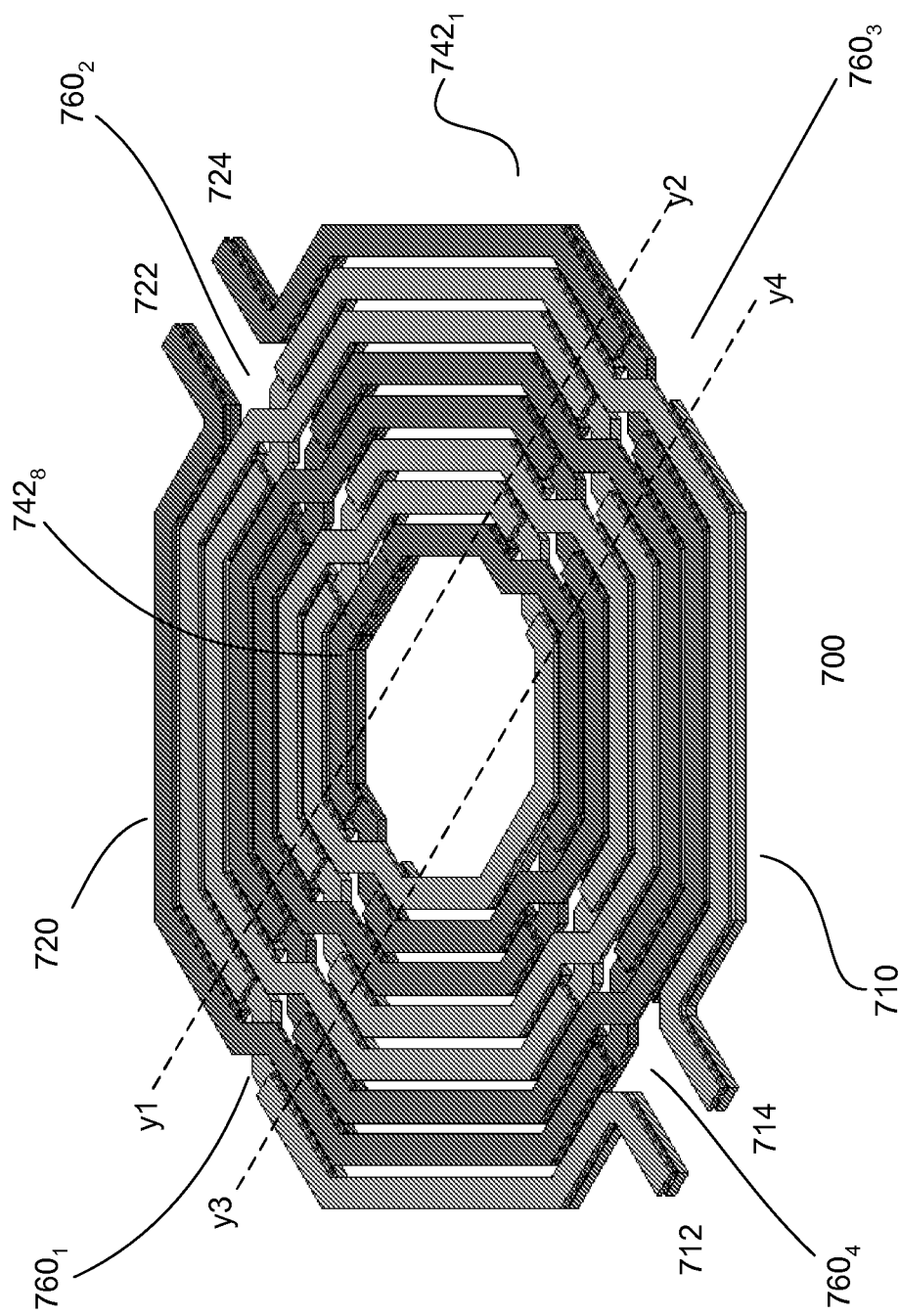
FIG. 7a shows a plan view of an embodiment of an integrated transformer.

FIG. 7a shows a plan view of another embodiment of an integrated transformer 700. The transformer is formed in a dielectric layer disposed on a device. The dielectric layer, for example, comprises an IMD layer. In one embodiment, the transformer is formed on two adjacent interconnect levels with a via level therebetween. Forming the transformer in other types of dielectric layer may also be useful.

The transformer includes first and second coils 710 and 720. The coils have coil elements disposed in a plurality of concentric ring placements of a transformer layout. As shown, the transformer includes first and second coils having coil elements disposed in eight concentric ring placements $742_1$-$742_8$, where 1 is the outmost ring placement and 8 is the innermost ring placement. In one embodiment, the transformer comprises a 1:1 turn ratio. As such, the first coil comprises 4 turns and the second coil comprises 4 turns.

First and second transformer terminals 712 and 714 are coupled to first and second ends of the first coil and third and fourth transformer terminals 722 and 724 are coupled to first and second ends of the second coil element.

The transformer terminals of the transformer are disposed on the outermost ring placement. As shown, the terminals of the first coil and the second coil are located on different sides of the outermost concentric ring of the transformer layout. Preferably, the terminals of the first coil and the second coil are located on opposing sides of the outermost concentric ring of the transformer layout. Other configurations of terminals and transformer layout are also useful.

In one embodiment, portions of the first coil and second coil share a concentric ring placement. Preferably, first and second coils share equal or substantially equal portions of a concentric ring placement. For example, each concentric ring placement is occupied by about 50% of the first coil and 50% of the second coil.

In one embodiment, cross-over locations or regions are provided in the transformer. The cross-over regions are similar to the one described in, for example, FIGS. 5b and 6c. The cross-over regions facilitate interleaving the coils of the transformer. In one embodiment, a cross connector in the cross-over region changes a routing of a coil from one ring placement to an adjacent ring placement. For example, the cross connector transfers the routing of a coil from the $n^{th}$ ring placement to the n−1 or n+1 ring placement, where n=1 to x.

The transformer layout comprises a plurality of sets of cross-over regions. In one embodiment, the transformer layout comprises a plurality of sets of cross-over regions which are equally spaced apart in the layout. For example, the transformer layout comprises 4 sets of cross-over regions $760_{1-4}$ equally spaced apart. The sets of cross-over regions separate the transformer layout into 4 equal quadrants or quarters. As for the innermost and outermost ring placements, they comprise two cross-over regions. The cross-over regions, for example, are disposed equidistance between the terminals. For example, the cross-over regions are disposed with the first and third sets of cross-over regions $760_1$ and $760_3$.

In one embodiment, the first coil terminal 712 is coupled to a first end of the first coil 710 in the outermost ring placement (e.g., n=1) along a first direction (e.g., clockwise). The first coil, with each encounter of a cross-over region, transitions to an adjacent inner ring placement (n=n+1) and continues in the first direction until it reaches the innermost ring (e.g., n=8 or x). When the first coil is in the innermost ring placement, it continues in the first direction and transitions to the next adjacent outer ring placement (e.g., n=n−1) with each encounter of a cross-over region until it reaches the outermost ring placement (e.g., n=1). At the outmost ring placement, the first coils continues in the first direction unit it couples to the second transformer terminal 714. For a transformer layout with 8 ring placements, this completes four turns of the first coil.

The third transformer terminal 722 is coupled to a first end of the second coil in the outer outermost ring along a second direction (e.g., counter clockwise). Similar to the first coil, the second coil transitions to an adjacent inner ring placement (n=n+1) with each encounter of a cross-over region and continues in the first direction until it reaches the innermost ring. When the second coil is in the innermost ring placement, it continues in the second direction and transitions to the next adjacent outer ring placement (e.g., n=n−1) with each encounter of a cross-over region until it reaches the outermost ring placement (e.g., n=1). At the outmost ring placement, the second coil continues in the second direction until it couples to the fourth transformer terminal 724. For a transformer layout with 8 ring placements, this completes four turns of the second coil.

Figure 7B:
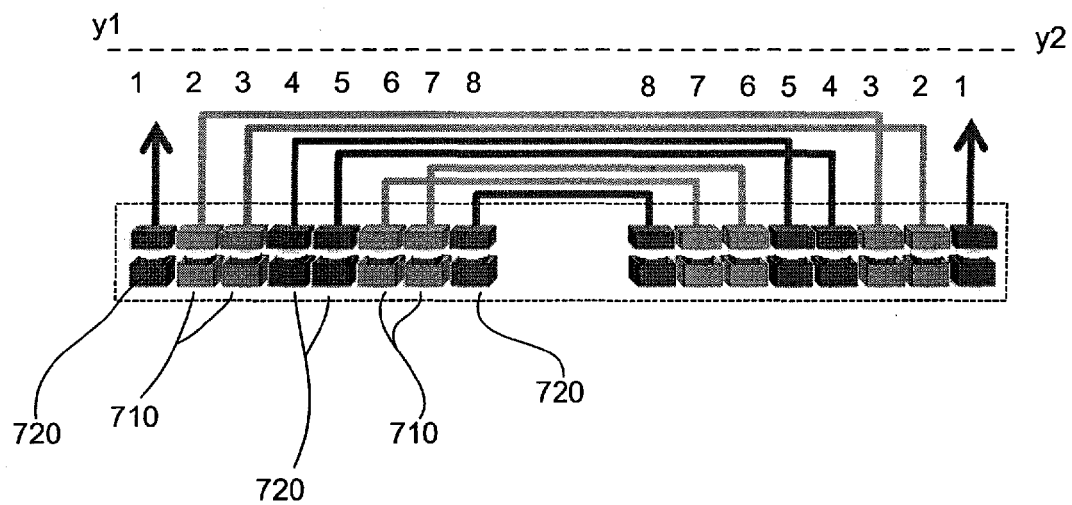
FIGS. 7b-c show cross-sectional views of a transformer along axes y1-y2 and y3-y4.
Figure 7C:
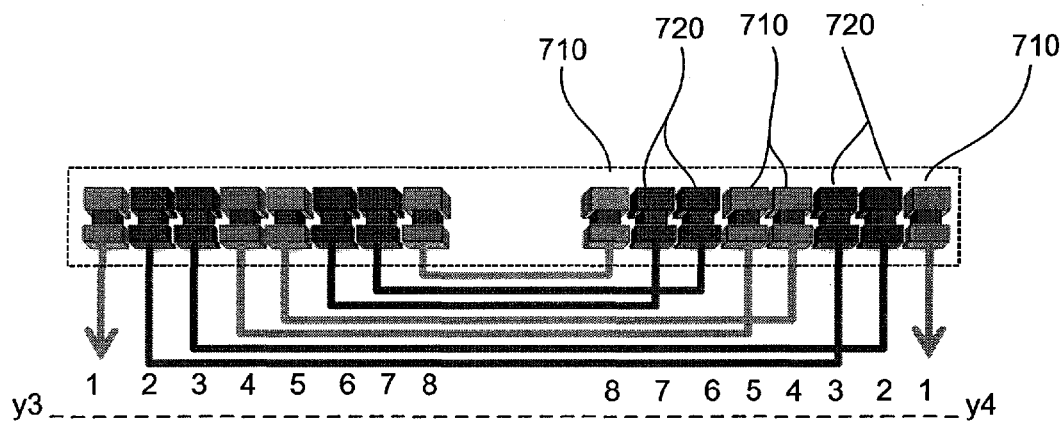

FIG. 7b-c show cross-sectional views of the transformer along the y1-y2 axis and y3-y4 axis. With the exception of the outermost and innermost ring placements ($n^{th}$ ring≠1 or x), a coil element in a ring placement (e.g., $n^{th}$ ring placement where n=2 to x−1) is magnetically coupled to a first coil element 710 in one of the adjacent ring placements (e.g., n=n+1 or n−1) and a second coil element 720 in the other of the adjacent ring placements (e.g., n=n−1 or n+1).

FIG. 8a shows a plan view of an embodiment of an integrated transformer 800. In one embodiment, the transformer comprises a 1:2 transformer. The transformer, for example, comprises a first coil 810 and a second coil 820 having a turn ratio of 1:2. For example, the second coil comprises twice the number of turns as the first coil.

The integrated transformer is formed in a transformer layout in a dielectric layer on a substrate. In one embodiment, the transformer layout comprises first and second transformer layout levels. In one embodiment, the first level comprises a first level layout which is, for example, similar to that shown in FIGS. 4a-b. For example, the first transformer layout comprises x concentric ring placements. The second level comprises a second transformer layout having x concentric ring placements. The first level, for example, is a top level and the second level is a bottom level. Providing a first level which is the bottom level and the second level which is the top level may also be useful. In one embodiment, the transformer layouts comprise hexagonal shaped concentric ring placements. Providing other shaped or number of concentric ring placements is also useful.

As shown, the first level comprises a first level transformer layout having first (outer or n=1) and second (inner or n=2) concentric ring placements and the second transformer layout comprises one concentric ring placements. In one embodiment, the concentric ring placements of the second transformer layout are aligned with the concentric ring placements of the first level.

In one embodiment, portions of the first coil and second coil share a concentric ring placement in the first level. Preferably, first and second coils share equal or substantially equal portions of a concentric ring placement. For example, each concentric ring placement is occupied by about 50% of the first coil and 50% of the second coil. The second coil occupies the transformer layout of the second level. In one embodiment, the second coil occupies about 50% of the outer ring placement and about 50% of the inner ring placement. For example, the second coil element tracks the layout of the first coil element in the first level. The transformer layouts form a 1:2 transformer in which the first coil has one turn and the second has two turns. Providing first and second layouts with other number of concentric placements may also be useful to form a 1:2 transformer in which the first and second coils have other number of turns.

The first coil includes first and second terminals 812 and 814. The first and second transformer terminals are coupled to first and second ends of the first coil. The second coil includes third and fourth transformer terminals 822 and 824 coupled to first and second ends thereof. As shown, the terminals of the first coil and the second coil are located on different sides of the outermost concentric ring of the transformer layout. Preferably, the terminals of the first coil and the second coil are located on opposing sides of the outermost concentric ring of the first level transformer layout. In one embodiment, the terminals and end portions of the transformer coils are disposed in the first transformer level. Other configurations of terminals and transformer layouts are also useful.

In one embodiment, cross-over regions 860 are provided in the transformer. FIG. 8b shows a magnified view of the cross-over location $860_1$ along the axis y1-y2. Similar to the cross-over region of FIG. 5b, the cross-over region comprises first and second cross connectors $862_1$ and $862_2$ to facilitate interleaving the coils of the transformer. In one embodiment, a cross connector changes a routing of a coil from one ring placement to an adjacent ring placement. For example, the cross connector transfers the routing of a coil from the $n^{th}$ ring placement to the n−1 or n+1 ring placement, where n=1 to x. A portion of the second coil 820 is disposed in the lower transformer level.

The cross-over location $860_1$, as shown, comprises a first cross connector $862_1$. The first cross connector connects one portion of the first coil 810 in the outer ring placement (n=1) to another portion in the inner ring placement (n=2). In one embodiment, the first cross connector is provided at or connects the lower portions of the first coil. As such, the first cross connector changes the routing of the first coil from the outer ring placement to the inner ring placement. Similarly, a second cross connector $862_2$ connects one portion of the second coil 820 in the outer ring placement (n=1) to another portion in the inner ring placement (n=2). In one embodiment, the second cross connector is provided at or connects the upper portions of the second coil. By providing the second cross connector, the routing of the second coil changes from the outer ring placement to the inner ring placement.

A second cross-over region $860_2$ may be provided for the transformer. Providing the transformer with other number of cross-over locations may also be useful. The second cross-over region may be similar to the first cross-over region. The second cross-over region includes first and second cross connectors to change the routing of the first coils from one concentric ring placement to an adjacent concentric ring placement. For example, the first connector changes the first coil routing from the inner ring placement to the outer ring placement; the second connector changes the second coil routing form the inner ring placement to the outer ring placement. As shown, the first connector connects lower portions of the first coil while the second connector connects upper portions of the second coil. Other configurations of cross connectors may also be useful.

In one embodiment, an open region is provided in the first transformer layout. The open region, for example, is disposed in the inner or innermost concentric ring placement. The open region, for example, is disposed on an opposite half of the first level transformer layout as the third and fourth transformer terminals. The open region provides coupling of the second coil to a second coil element in the second transformer level.

The first transistor coil 810, in one embodiment, is similar to that shown in FIG. 5a. For example, the first transformer terminal 812 is coupled to a first end of the first coil disposed in the outer concentric ring placement along a first direction (e.g., counter clockwise). The first coil changes to the inner concentric ring placement at the second cross-over region $860_2$ and continues in the first direction to the first cross-over region $860_1$, where it changes to the outer concentric ring placement. The first coil continues to the second end where it is coupled to the second transformer terminal 814.

The second transistor coil 820 is coupled to the third transformer terminal 822. The second transistor coil continues along a second direction (e.g., clockwise) to the second cross-over region where it continues in the second direction to the open region in the inner or innermost concentric ring. The open region facilitates coupling of the second coil in the first level to the second level. In one embodiment, the open region couples the second coil in the inner ring placement to the second coil in the second level aligned with the outer ring placement. The second coil continues in the second direction unit the open region, where it continues in the inner ring placement in the first level. The second coil continues along the second direction in the inner ring placement until the first cross-over region where it changes to the outer ring placement and continues until it is coupled to the fourth transformer terminal.

FIG. 9a shows a plan view of an embodiment of an integrated transformer 900. FIG. 9b shows a cross-over region in greater detail. The transformer is similar to that described in FIGS. 8a-b except that a fifth transformer terminal 926 is coupled to the second coil in the lower transformer level. In one embodiment, the fifth transformer terminal is disposed in the second coil to separate the second coil into two equal or substantially equal halves. In one embodiment, the fifth transformer terminal is disposed in the lower transformer level below the third and fourth transformer terminals.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor transformer disposed in a dielectric layer on a substrate comprising:
   an integrated transformer arranged in a transformer layout and having a plurality of cross-over locations, the integrated transformer being disposed in an upper and a lower metal level, and the transformer layout on the upper and lower metal levels being aligned except at the cross-over locations, wherein the cross over locations comprise of an upper cross connector and a lower cross connector separated by dielectric material in a via level between the upper and lower metal levels.

2. A semiconductor device comprising:
   a substrate;
   a dielectric layer disposed over the substrate, the dielectric layer having an upper level and a lower level separated by a via level, wherein the upper and lower levels are adjacent metal levels, the upper level includes upper trenches and the lower level includes lower trenches corresponding to a transformer layout; and
   an integrated transformer arranged in the transformer layout including a plurality of cross-over locations, wherein the integrated transformer is disposed in the upper and lower trenches filled with conductor material, the transformer layout for the upper and lower trenches being aligned except at the cross-over locations, and the plurality of cross-over locations comprise of an upper cross connector and a lower cross connector separated by dielectric material in the via level.

3. The semiconductor device of claim 2 wherein the integrated transformer is disposed in the upper and lower trenches filled with conductor material and coupled at the via level except at the cross-over locations.

4. The semiconductor device of claim 3 wherein the integrated transformer comprises first and second coil elements and the transformer layout comprises hexagonal shaped concentric ring placements with outer and inner concentric ring layers.

5. The semiconductor device of claim 2 wherein the plurality of cross-over locations separate the transformer layout into four equal quadrants.

6. The semiconductor device of claim 2 wherein the integrated transformer comprises first and second coil elements and the transformer layout comprises outer and inner concentric ring placements.

7. The semiconductor device of claim 6 wherein the first coil element crosses over from a first ring placement to a second ring placement in a first cross-over location and second coil element crosses over from a first ring placement to a second ring placement in a second cross-over location.

8. The semiconductor device of claim 7 wherein the cross connectors change a routing of a coil from one ring placement to an adjacent ring placement.

9. The semiconductor device of claim 6 wherein the cross connectors form an angle which is greater than 90 degrees with respect to the coil elements they are coupling.

10. The semiconductor transformer of claim 1 wherein the integrated transformer is disposed in the upper and lower metal levels and coupled at the via level except at the cross-over locations.

11. The semiconductor transformer of claim 1 wherein the integrated transformer comprises first and second coil elements and the transformer layout comprises hexagonal shaped concentric ring placements with outer and inner concentric ring layers.

12. The semiconductor transformer of claim 1 wherein the integrated transformer comprises first and second coil elements and the first and second coil elements share a concentric ring placement.

13. The semiconductor transformer of claim 1 wherein the plurality of cross-over locations separate the transformer layout into four equal quadrants.

14. The semiconductor transformer of claim 13 wherein the first coil element crosses over from an outer ring placement to an inner ring placement in a first cross-over location and the second coil element crosses over from an inner ring placement to an outer ring placement in a second cross-over location.

15. The semiconductor transformer of claim 1 wherein the upper and lower cross connectors change a routing of a coil from one ring placement to an adjacent ring placement.

16. The semiconductor transformer of claim 1 wherein the two adjacent metal levels are formed in upper and lower trench levels in the dielectric layer with a via level separating the upper and lower trench levels.

17. The semiconductor device of claim 2 wherein the first and second coil elements are disposed in a plurality of concentric ring placements.

18. The semiconductor device of claim 17 wherein portions of the first coil and second coil share a concentric ring placement.

19. The semiconductor device of claim 17 wherein the transformer layout comprises a plurality of sets of cross-over locations.

20. The semiconductor device of claim 2 wherein the transformer layout further includes an open region.

* * * * *